United States Patent
Liu

(10) Patent No.: US 9,330,924 B2
(45) Date of Patent: May 3, 2016

(54) METHOD FOR FORMING CONTROL GATE SALICIDE

(71) Applicant: SEMICONDUCTOR MANUFACTURING INTERNATIONAL (SHANGHAI) CORPORATION, Shanghai (CN)

(72) Inventor: Huanxin Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/846,646

(22) Filed: Sep. 4, 2015

(65) Prior Publication Data

US 2016/0093498 A1    Mar. 31, 2016

(30) Foreign Application Priority Data

Sep. 29, 2014 (CN) .......................... 2014 1 0519468

(51) Int. Cl.
| | | |
|---|---|---|
| *H01L 21/4763* | (2006.01) | |
| *H01L 21/28* | (2006.01) | |
| *H01L 29/423* | (2006.01) | |

(52) U.S. Cl.
CPC .... *H01L 21/28273* (2013.01); *H01L 29/42324* (2013.01)

(58) Field of Classification Search
CPC .................. H01L 21/28273; H01L 21/32053; H01L 29/42324; H01L 29/66515
USPC ......... 438/593, 594, 201, 211, 259, 649, 655, 438/682, 683
See application file for complete search history.

(56) References Cited

U.S. PATENT DOCUMENTS

| | | | | |
|---|---|---|---|---|
| 7,396,720 B2* | 7/2008 | Sandhu | ................ | H01L 27/115 257/315 |
| 2004/0043549 A1* | 3/2004 | Sayama | ............ | H01L 21/28044 438/197 |
| 2004/0113212 A1* | 6/2004 | Lee | .................... | H01L 21/28114 257/408 |
| 2015/0311218 A1* | 10/2015 | Hsu | ..................... | H01L 29/4933 257/316 |

* cited by examiner

*Primary Examiner* — Kevin M Picardat
(74) *Attorney, Agent, or Firm* — Kilpatrick Townsend & Stockton LLP

(57) ABSTRACT

A method for forming a semiconductor device includes forming a conductive structure of a silicon material on a substrate and forming a planarized dielectric layer adjacent the conductive structure. The method also includes removing a portion of the dielectric layer to expose a top portion of the conductive structure and removing an outer portion of the exposed top portion of the conductive structure such that the top portion of the gate structure has a narrower width than the unexposed portion. The method further includes forming a metal layer over the exposed portion of the gate structure and a top surface of the dielectric layer, and forming a silicide layer over the top portion of the conductive structure. The width of the silicided top portion of the conductive structure is substantially the same as the width of the bottom portion of the conductive structure.

20 Claims, 6 Drawing Sheets

METHOD FOR FORMING CONTROL GATE SALICIDE

CROSS-REFERENCES TO RELATED APPLICATIONS

This application claims priority to Chinese patent application No. 201410519468.1, filed on Sep. 29, 2014, the content of which is incorporated herein by reference in its entirety.

BACKGROUND OF THE INVENTION

The present invention relates to semiconductor technologies, and more particularly to manufacturing for the fabrication of semiconductor devices.

In the field of semiconductor technology, including NAND-type flash memory semiconductor device having a broad application prospects. However, with decreasing integrated circuit (IC) feature size, the inventor has identified certain limitations in conventional technology. For example, isolation of the control gates and metal silicide formation on the control gate are two major challenges facing NAND-type flash memory, as explained below. FIGS. 1A to 1C are cross-sectional view diagrams illustrating a conventional method for silicide formation on the control gate, which includes the following steps:

Step E1: Form a control gate 101 and sidewalls 102 on a substrate 100. An interlayer dielectric 103 is formed on the device structure, as shown in FIG. 1A.

Step E2: Etch dielectric layer 103, sidewall 102, and control gate 101 to expose a portion of control gate 101, as shown in FIG. 1B;

Step E3: Form a silicide layer 104, as shown in FIG. 1C.

FIG. 1D is an SEM micrograph illustrating profiles of silicide formed using the conventional method. It can be seen that the silicide exhibits an undesirable profile, including protruding portions on the sidewalls. Therefore, these conventional solutions are not satisfactory and an improved method is needed.

BRIEF SUMMARY OF THE INVENTION

Embodiments of the present invention relate to semiconductor technologies, and more particularly to manufacturing for the fabrication of semiconductor devices. Specific embodiments are directed methods for forming silicide on a control gate of a nonvolatile device. However, the techniques can also be used in other applications, for example, in forming metal-semiconductor compound layers on any semiconductor structures.

According to some embodiments of the invention, a method for forming a semiconductor device includes forming a conductive structure of a silicon material on a substrate and forming a planarized dielectric layer adjacent the conductive structure. The method also includes removing a portion of the dielectric layer to expose a top portion of the conductive structure and removing an outer portion of the exposed top portion of the conductive structure such that the top portion of the conductive structure has a narrower width than the unexposed portion. The method further includes forming a metal layer over the exposed portion of the conductive structure and a top surface of the dielectric layer, and forming a silicide layer over the top portion of the conductive structure. The width of the silicided top portion of the conductive structure is substantially the same as the width of the bottom portion of the conductive structure.

In some embodiments of the above method, the conductive structure can be a gate structure for an MOS transistor. In some embodiments, the conductive structure can be a control gate structure for a non-volatile memory device. In some embodiments, the conductive structure can be an interconnect conductive line. In some embodiments, the conductive structure can be a top plate of a capacitor.

In some embodiments, the planarized dielectric layer includes spacers on side walls of the conductive structure and an interlayer dielectric layer. In some embodiments, removing a portion of the dielectric layer includes using a wet etching process to remove a portion of the interlayer dielectric layer, and using a dry etching process to remove a portion of the side wall spacers. In some embodiments, the wet etching process comprises a diluted hydrofluoric acid (DHF), in which the volume ratio of hydrofluoric acid to $H_2O$ is in a range of from about 1:100 to about 1:300. In some embodiments, removing a portion of the dielectric layer includes using diluted hydrofluoric acid (DHF) to remove a first thickness of the dielectric layer, using a dry etching process to remove a portion of the side wall spacers, and using diluted hydrofluoric acid (DHF) to remove a second thickness of the dielectric layer. In some embodiments, the first thickness is about 100 Å, and the second thickness is about 15-30 Å.

In some embodiments, removing a portion of the dielectric layer further comprises removing at least a portion of a native oxide. In some embodiments, removing an outer portion of the exposed top portion of the conductive structure comprises using a TMAH (tetramethylammonium hydroxide) solution with a density of 2.38% at an etch temperature of about 25-30° C. In some embodiments, the method also includes removing the outer portion by a thickness of about 15-25 Å. In some embodiments, the metal layer includes a NiPt (nickel-platinum) alloy.

According to some embodiments of the present invention, a method for forming a semiconductor device includes forming a conductive structure of a semiconductor material on a substrate and forming a dielectric layer adjacent the conductive structure. The method also includes removing a portion of the dielectric layer to expose a top portion of the conductive structure, and removing an outer portion of the exposed top portion of the conductive structure such that the top portion of the conductive structure has a narrower width than the unexposed portion. The method further includes forming a metal layer over the exposed portion of the conductive structure and a top surface of the dielectric layer, and forming a metal-semiconductor compound layer over the top portion of the conductive structure.

In some embodiments, the width of the top portion of the conductive structure including the metal-semiconductor compound layer is substantially the same as the width of the bottom portion of the conductive structure. In some embodiments, the semiconductor layer includes silicon. In some embodiments, the metal-semiconductor compound layer can include a silicide material. In some embodiments, the dielectric layer includes spacers on side walls of the conductive structure and an interlayer dielectric layer. In some embodiments, removing a portion of the dielectric layer includes using a wet etching process to remove a portion of the interlayer dielectric layer, and using a dry etching process to remove a portion of the side wall spacers. In some embodiments, the conductive structure can be a control gate structure for a non-volatile memory device. In some embodiments, the conductive structure can be an interconnect conductive line.

The following description, together with the accompanying drawings, will provide a better understanding of the nature and advantages of the claimed invention.

DETAILED DESCRIPTION OF THE INVENTION

Figure 1A:
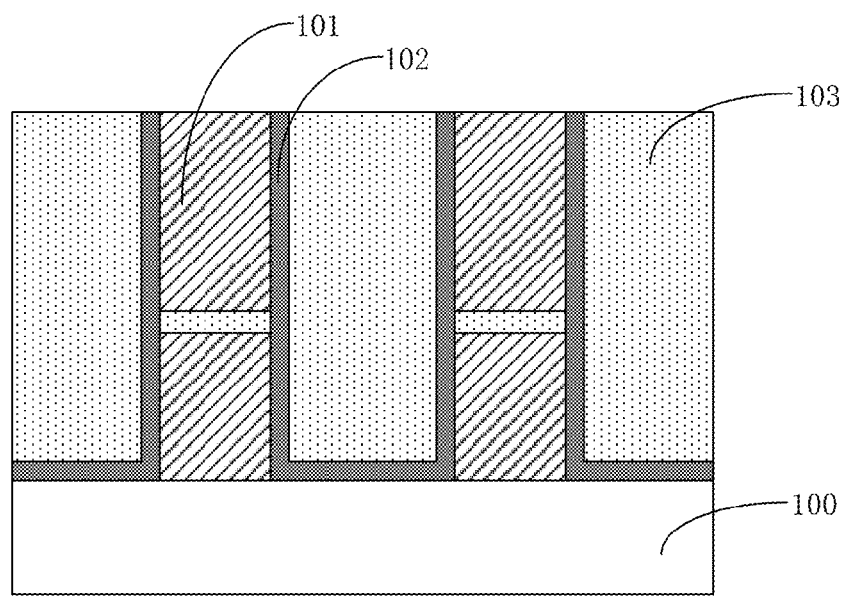
FIGS. 1A, 1B, and 1C are cross-sectional view diagrams illustrating a conventional method for forming a semiconductor device structure.
Figure 1B:
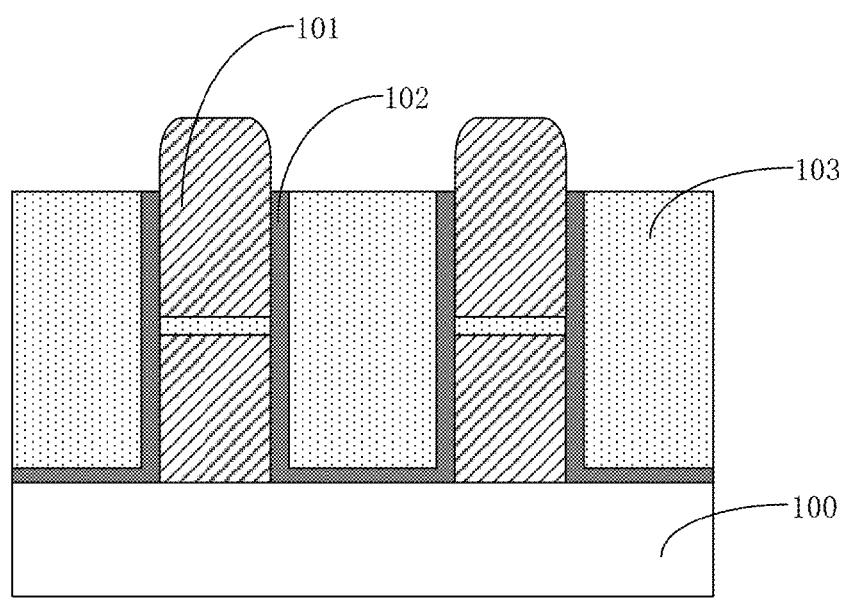
Figure 1C:
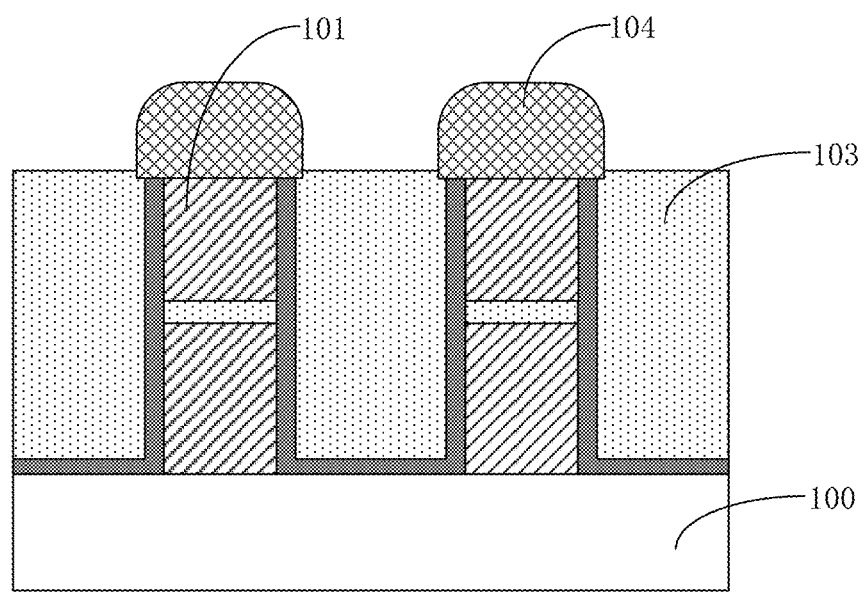
Figure 1D:
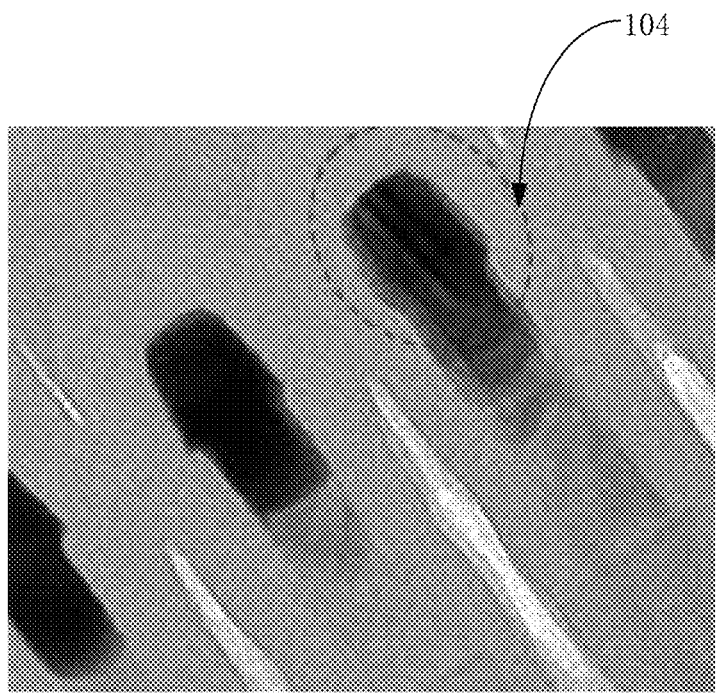
FIG. 1D is a scanning electron microscope (SEM) micrograph illustrating a semiconductor device structure formed by the conventional method.

Embodiments of the present invention are related to a semiconductor device manufacturing method. Some embodiments of the present invention are directed to the formation process of the control gate metal silicide. The method can be used, e. g., in the manufacture of semiconductor devices including NAND-type flash memory (Flash) semiconductor devices. Some embodiments of the present invention are directed to the formation process of the control gate metal silicide.

In the following description, numerous specific details are provided fora thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denotes the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place, Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

FIGS. 2A, 2B, 2C, and 2D are cross-sectional view diagrams illustrating a method for forming a semiconductor device structure according to an embodiment of the present invention. The method includes several steps, which are described in detail below.

Figure 2A:
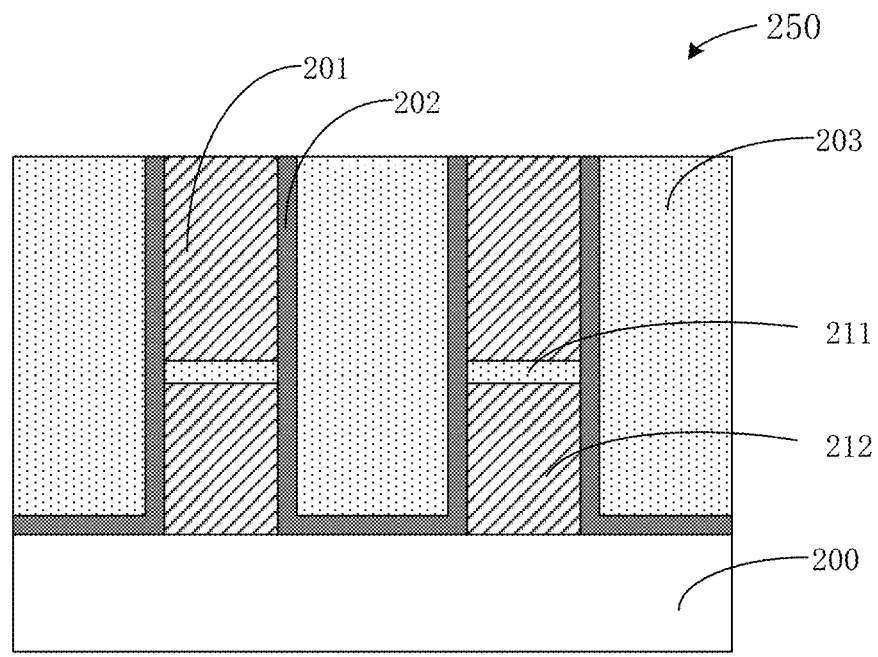
FIGS. 2A, 2B, 2C, and 2D are cross-sectional view diagrams illustrating a method for forming a semiconductor device structure according to an embodiment of the present invention.

At step A1, as shown in FIG. 2A, a semiconductor structure 250 is formed and includes a semiconductor substrate 200 and a conductive structure 201. Semiconductor structure 250 could be part of a NAND memory array, in which case control gate 201 is disposed on a dielectric 211 which overlies a floating gate 212, for example. Sidewall spacers are disposed on the sides of control gate 201. In addition, interlayer dielectric layer 203 is deposited between the gate structures and planarized to provide a flat surface for subsequent process steps. In the examples described below, conductive structure 201 will be referred to as control gate 201. However, conductive structure 201 can include other device structures of a semiconductor material, for example, a gate of a transistor, a control gate of a nonvolatile memory device, an interconnect line, or a top plate of a capacitor, etc.

Interlayer dielectric layer 203 can be formed using FCVD (fluid chemical vapor deposition) or PETEOS (plasma enhanced TEOS, where TEOS stands for Tetraethyl orthosilicate deposition), or thermal oxidation to form a dielectric material on semiconductor substrate 200. The dielectric material is then planarized by CMP (chemical mechanical polishing) to remove portions of the dielectric material above control gate 201 to form interlayer dielectric layer 203. The material of the interlayer dielectric layer may include silicon oxide, or TEOS (Tetraethyl orthosilicate), or other suitable material.

Figure 2B:
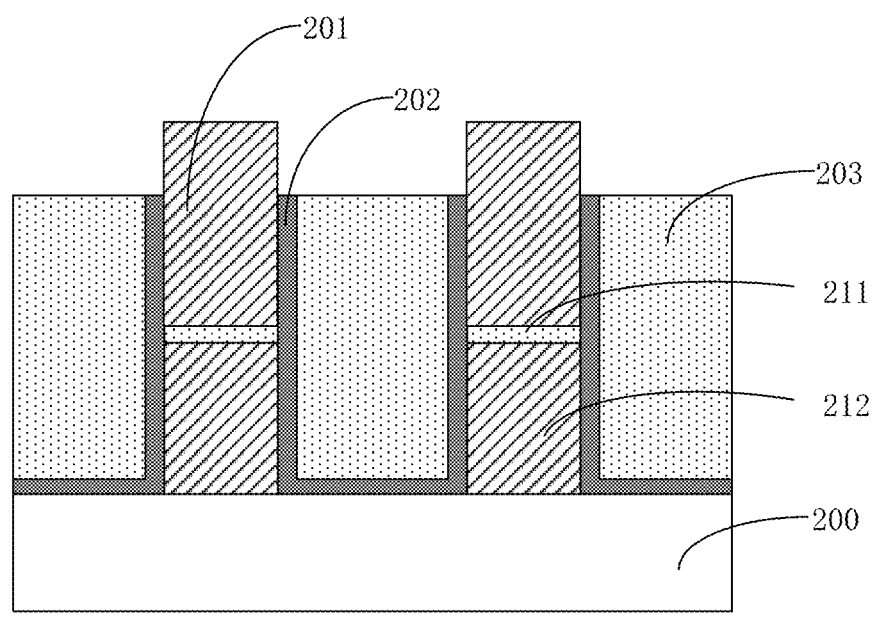

At step A2, as shown in FIG. 2B, portions of interlayer dielectric layer 203 and sidewall spacers 202 are removed to expose a portion of control gate 201. A diluted hydrofluoric acid (DHF) can be used for this process. For example, in the DHF process, the ratio of HF to $H_2O$ may be in a range of 1:100 to 1:300, and the etch temperature can be at room temperature. The etch can also be carried out using dry etching or a combination of dry and wet etching using known processes.

In an embodiment, step A2 can include the following sub steps:

Step A21: Using DHF to remove a first thickness of the interlayer dielectric to expose a portion of the sidewall spacers;

Step A22: Using a dry etch to remove the exposed portion of the sidewall spacers;

Step A23: Using DHF to remove a second thickness of the interlayer dielectric.

In this step, it is also possible to remove at least a portion of the oxide layer located on both sides of the control gate, using DHF etching or other suitable methods. The oxide layer located on either side of the control gate can include a native oxide layer that is typically formed by natural oxidation, such as due to exposure to moisture at room temperature. As described above, in this embodiment, both DHF etching and dry etching are used, and this step does not result in improper etching of control gate 201.

Figure 2C:
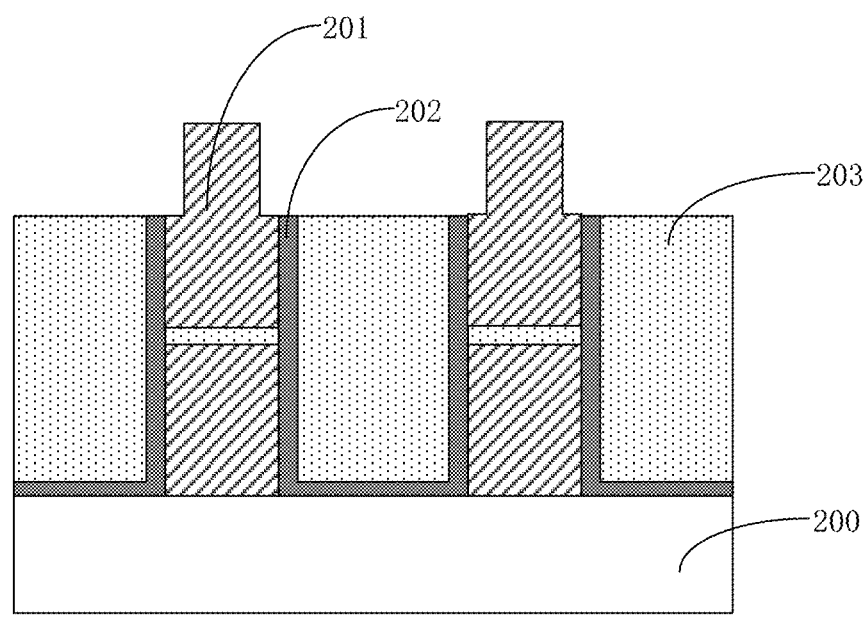

At step A3, as shown in FIG. 2C, control gate 201 is etched back using TMAH (tetramethylammonium hydroxide) in some embodiments. After the etching back, a portion of control gate 201 in the width direction is removed. Therefore, the exposed portion of control gate 201 is narrower than the lower portion, as shown in FIG. 2C. As an example, the etch back can be carried out using a TMAH at a concentration of 2.38% and at a process temperature of 25~30° C. In a specific example, the control gate is removed in the gate width direction by about 15~25 Å.

In the present embodiment, the etching using TMAH, will not cause undue etching of the control gate 201. The etching speed in the gate width direction is uniform. Thus, the exposed portion of control gate 201 will have a uniform width, and have a good morphology for subsequent processing.

At step A4, a pre-clean is carried out to remove the surface oxide from control gate 201. This step can be carried out using known processes for pre-silicide clean. For example, SiCoNi™ is used to refer to a class of remote plasma assisted dry etch processes which involve the simultaneous exposure of a substrate to hydrogen- and fluorine-containing plasma effluents. Remote plasma excitation of the hydrogen and fluorine species allows substrate processing with low plasma-damage. SiCoNi™ etches have been developed which are largely conformal and selective towards silicon oxide layers while, not readily etching silicon, SiCoNi™ etch processes also remove other silicon-containing dielectric layers such as silicon nitride and silicon oxynitride. It is noted that other pre-clean methods can also be used. For example, a wet clean process or other remote plasma etch process can also be used.

At step A5, a metal material is deposited on the control gate. Then, an annealing process is carried out to form a first metal silicide. The metal can be NiPt (nickel platinum) or other suitable materials, such as tungsten (W), cobalt (Co), nickel (Ni), platinum (Pt), etc. The first annealing process can be a rapid thermal annealing process. These processes can be carried out using known methods. Further, depending on the semiconductor material and metal material used, the reaction product may be a metal semiconductor compound, and not limited to silicide.

Figure 2D:
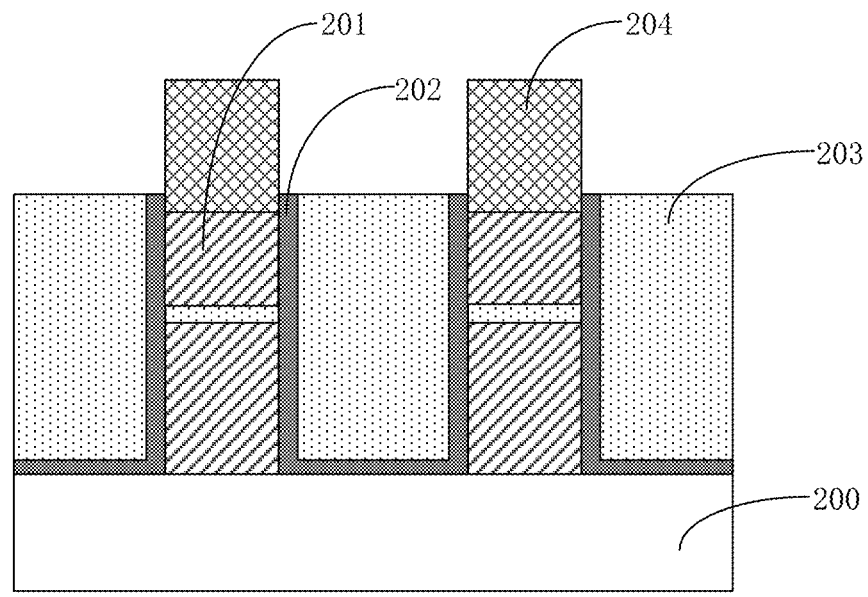

At step A6, as shown in FIG. 2D, the unreacted metal is removed, and a second annealing process is carried out to form metal silicide on the control gate. Here, the method of removing unreacted metal can include a wet stripping or other suitable process. The second thermal annealing process can be a rapid thermal annealing process.

As described above, in the present embodiment, the use of DHF etching and a dry etching step and the use of TMAH etched back can result in a uniform profile in the exposed portions of the control gate, as shown in FIG. 2C. Accordingly, it is possible to ensure the control gate metal silicide 204 that is finally formed will avoid irregular topography of the control gate metal silicide 204, as shown in FIG. 2D.

Figure 2E:
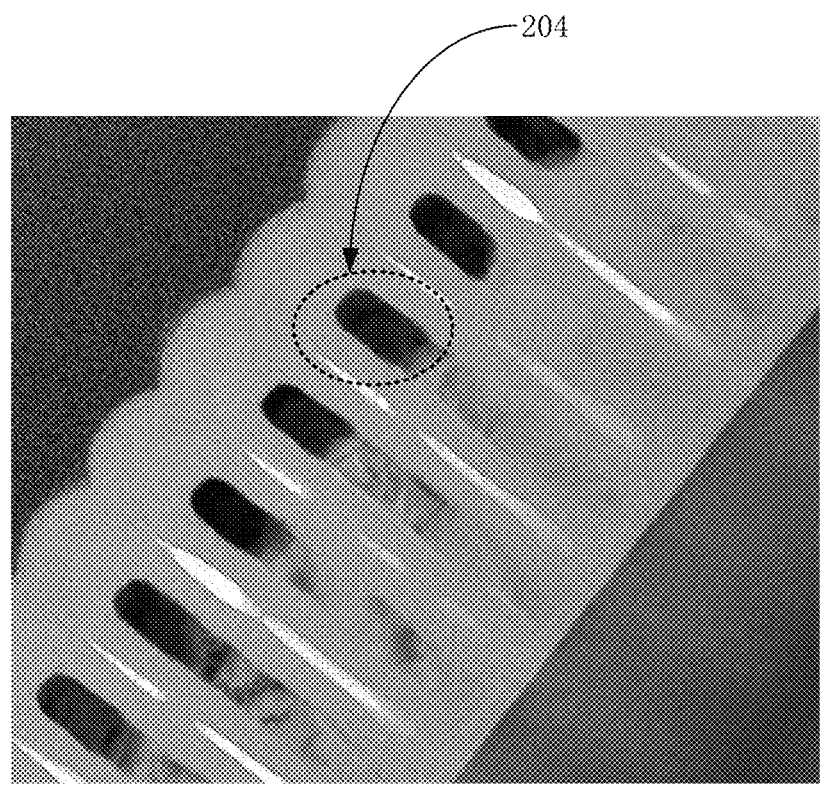
FIG. 2E is a scanning electron microscope (SEM) micrograph illustrating a semiconductor device structure formed by the method according to an embodiment of the present invention.

FIG. 2E is a scanning electron microscope (SEM) micrograph illustrating a semiconductor device structure formed by a method according to an embodiment of the present invention. It can be seen that the silicided control gate has a substantially uniform profile. A self-aligned silicide (salicide) structure is thus formed. In embodiments of the invention, the amount of removal of the silicon control gate, or other conductive material, is selected such that the file profile after the metal semiconductor material is uniform.

Figure 3:
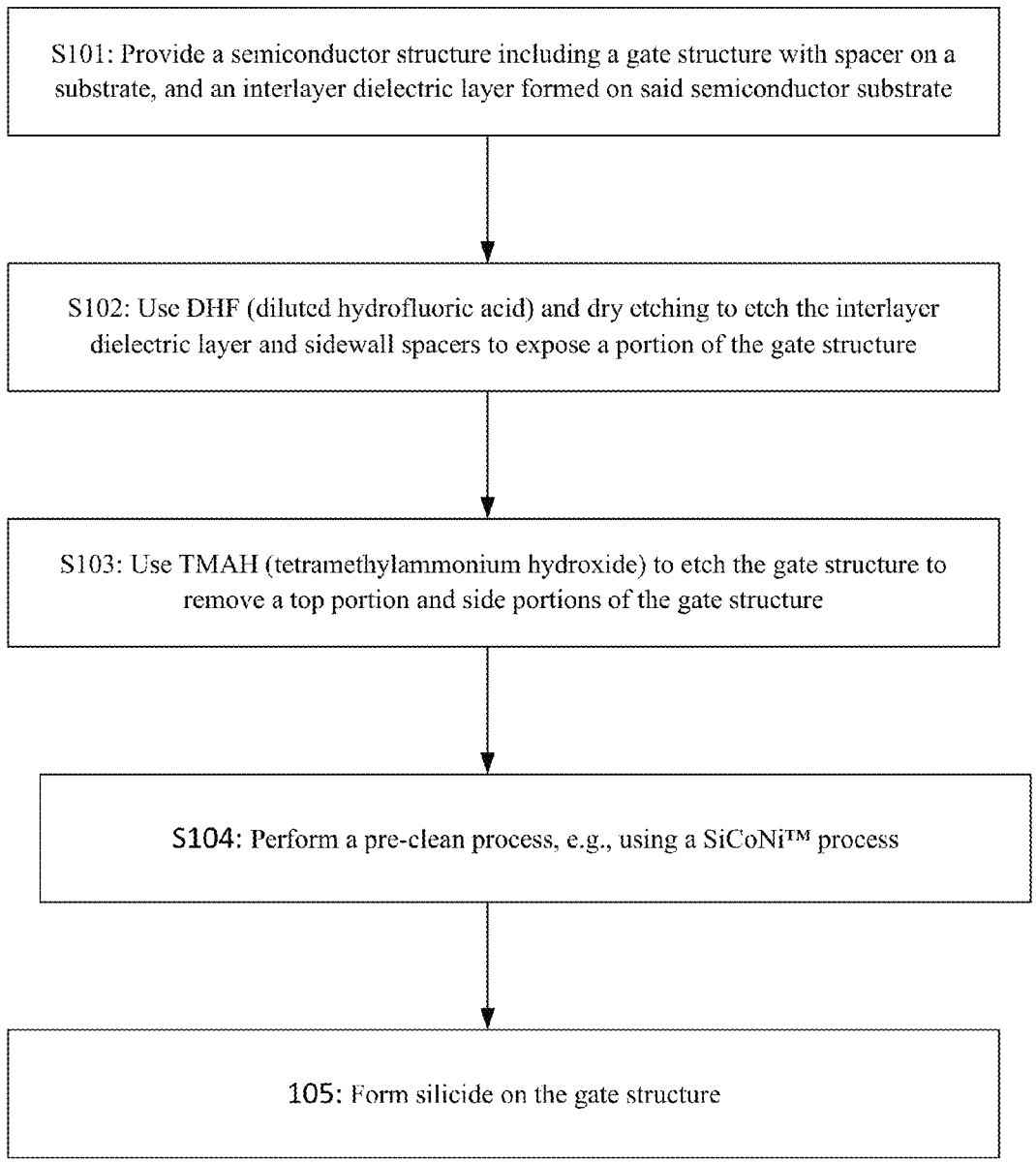
FIG. 3 is a simplified flow chart illustrating a method for forming a semiconductor device structure according to an embodiment of the present invention.

FIG. 3 is a simplified flow chart illustrating a method for forming a semiconductor device structure according to an embodiment of the present invention.

Step S101: Provide a semiconductor structure including a gate structure on a substrate, with spacers disposed on sidewalls of the gate structure and an interlayer dielectric layer formed on said semiconductor substrate;

Step S102: Use DHF (diluted hydrofluoric acid) and dry etching to etch the interlayer dielectric layer and sidewall spacers to expose a portion of the gate structure;

Step S103: Use TMAH (tetramethylammonium hydroxide) to etch the gate structure to remove a top portion and side portions of the gate structure;

Step S104: Perform a pre-clean process, e.g., using a SiCoNi™ process;

Step S105: Form silicide on the gate structure. The silicidation process can include depositing a metal on the gate structure, perform a first thermal annealing process to form a first metal silicide, remove unreacted metal, and perform a second thermal annealing process to form the gate metal silicide.

Embodiments of the present invention also provide an electronic device, including a semiconductor device and electronic components coupled with the semiconductor device. The semiconductor device is formed using a method of manufacturing a semiconductor device according to one embodiment of the semiconductor device described above. The electronic components may include any electronic components including discrete devices and integrated circuits. The electronic device can include laptops, netbooks, game consoles, televisions, VCD, DVD, navigation systems, cameras, video cameras, voice recorder, MP3, MP4, PSP and other electronic products or equipment. The electronic device of the present embodiment may also include a mobile phone, tablet PC, and it may include any intermediate product of the semiconductor device.

While the present invention is described herein with reference to illustrative embodiments, this description is not intended to be construed in a limiting sense. In order not to obscure the scope of the invention, many details of well-known processes and manufacturing techniques are omitted. Various modifications of the illustrative embodiments as well as other embodiments will be apparent to those of skill in the art upon reference to this description. For example, although methods of forming a metal semiconductor compound layer are described, it is understood that the other materials of similar structures can also be used. For example, a top portion of a silicon pillar can be first shaped to be thinner than a lower portion, such that after an oxide layer is grown over the top portion, the profile of the resulting pillar can be substantially uniform without a distorted profile. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for forming a semiconductor device, comprising:
    forming a control gate structure of a silicon material on a substrate;
    forming a planarized dielectric layer adjacent the control gate structure;
    removing a portion of the dielectric layer to expose a top portion of the control gate structure;
    removing an outer portion of the exposed top portion of the control gate structure such that the top portion of the control gate structure has a narrower width than the unexposed portion;
    forming a metal layer over the exposed portion of the control gate structure and a top surface of the dielectric layer; and
    forming a silicide layer over the top portion of the control gate structure, such that the width of the silicided top portion of the control gate structure is substantially the same as the width of the bottom portion of the control gate structure.

2. The method of claim 1, wherein forming a control gate structure comprises:
    forming a floating gate on the substrate;
    forming an insulating layer over the floating gate; and
    forming a control gate over the insulating layer.

3. The method of claim 1, wherein the planarized dielectric layer includes spacers on side walls of the conductive structure and an interlayer dielectric layer.

4. The method of claim 3, wherein removing a portion of the dielectric layer comprises:
    using a wet etching process to remove a portion of the interlayer dielectric layer; and
    using a dry etching process to remove a portion of the side wall spacers.

5. The method of claim 4, wherein the wet etching process comprises a diluted hydrofluoric acid (DHF), in which the volume ratio of hydrofluoric acid to $H_2O$ is in a range of from about 1:100 to about 1:300.

6. The method of claim 4, removing a portion of the dielectric layer comprises:
    using diluted hydrofluoric acid (DHF) to remove a first thickness of the dielectric layer;
    using a dry etching process to remove a portion of the side wall spacers; and
    using diluted hydrofluoric acid (DHF) to remove a second thickness of the dielectric layer.

7. The method of claim 6, wherein the first thickness is about 100 A, and the second thickness is about 15-30 A.

8. The method of claim 3, wherein removing a portion of the dielectric layer further comprises removing at least a portion of a native oxide.

9. The method of claim 1, wherein removing an outer portion of the exposed top portion of the conductive structure comprises using a TMAH (Tetramethylammonium hydroxide) solution with a density of 2.38% at an etch temperature of about 25-30° C.

10. The method of claim 9, further comprising removing the outer portion by a thickness of about 15-25 Å.

11. The method of claim 1, wherein the metal layer comprises a NiPt (nickel-platinum) compound.

12. A method for forming a semiconductor device, comprising:
    forming a conductive structure of a semiconductor material on a substrate;
    forming a dielectric layer adjacent the conductive structure;
    removing a portion of the dielectric layer to expose a top portion of the conductive structure;
    removing an outer portion of the exposed top portion of the conductive structure such that the top portion of the gate structure has a narrower width than the unexposed portion;
    forming a metal layer over the exposed portion of the gate structure and a top surface of the dielectric layer; and
    forming a metal-semiconductor compound layer over the top portion of the conductive structure.

13. The method of claim 12, wherein the width of the top portion of the conductive structure includes a metal-semiconductor compound layer that has a width that is substantially the same as the width of the bottom portion of the conductive structure.

14. The method of claim 12, wherein the conductive structure is a control gate structure for a non-volatile memory device.

15. The method of claim 12, wherein the conductive structure is a gate structure for an MOS transistor.

16. The method of claim 12, wherein the conductive structure is an interconnect conductive line.

17. The method of claim 12, wherein the conductive structure is a top plate of a capacitor.

18. The method of claim 12, wherein the metal-semiconductor compound layer comprises a silicide material.

19. The method of claim 12, wherein the dielectric layer includes spacers on side walls of the conductive structure and an interlayer dielectric layer.

20. The method of claim 19, wherein removing a portion of the dielectric layer comprises:
   using a wet etching process to remove a portion of the interlayer dielectric layer; and
   using a dry etching process to remove a portion of the side wall spacers.

* * * * *